United States Patent
Lee et al.

(10) Patent No.: US 10,964,618 B2
(45) Date of Patent: Mar. 30, 2021

(54) SEMICONDUCTOR PACKAGE AND METHOD OF MANUFACTURING THE SAME

(71) Applicant: Samsung Electronics Co., Ltd., Suwon-si (KR)

(72) Inventors: Jang-woo Lee, Asan-si (KR); Kyung-suk Oh, Seongnam-si (KR); Yung-cheol Kong, Cheonan-si (KR); Woo-hyun Park, Seongnam-si (KR); Jong-bo Shim, Asan-si (KR); Jae-myeong Cha, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/529,331

(22) Filed: Aug. 1, 2019

(65) Prior Publication Data

US 2020/0168522 A1   May 28, 2020

(30) Foreign Application Priority Data

Nov. 23, 2018   (KR) .................. 10-2018-0146611

(51) Int. Cl.
| | | |
|---|---|---|
| H01L 23/367 | (2006.01) | |
| H01L 25/18 | (2006.01) | |
| H01L 23/31 | (2006.01) | |
| H01L 23/373 | (2006.01) | |
| H01L 23/00 | (2006.01) | |
| H01L 21/56 | (2006.01) | |

(52) U.S. Cl.
CPC ........ *H01L 23/3675* (2013.01); *H01L 21/565* (2013.01); *H01L 23/3185* (2013.01); *H01L 23/3738* (2013.01); *H01L 24/32* (2013.01); *H01L 24/33* (2013.01); *H01L 24/73* (2013.01); *H01L 25/18* (2013.01); *H01L 2224/32145* (2013.01); *H01L 2224/32245* (2013.01); *H01L 2224/33181* (2013.01); *H01L 2224/73253* (2013.01); *H01L 2224/73265* (2013.01)

(58) Field of Classification Search
CPC .............. H01L 23/3675; H01L 21/565; H01L 23/3185; H01L 23/3738; H01L 25/18; H01L 24/73; H01L 24/33; H01L 2224/73265
USPC ........ 257/713, 712, 717, 725; 438/109, 117, 438/122
See application file for complete search history.

(56) References Cited

U.S. PATENT DOCUMENTS

| | | |
|---|---|---|
| 7,361,986 B2 | 4/2008 | Yuan et al. |
| 9,177,942 B2 | 11/2015 | Kim et al. |
| 9,190,338 B2 | 11/2015 | Park et al. |
| 9,793,187 B2 | 10/2017 | Lin et al. |
| 9,865,570 B1 | 1/2018 | England et al. |
| 9,960,099 B2 | 5/2018 | Tseng et al. |

(Continued)

*Primary Examiner* — Thinh T Nguyen
(74) *Attorney, Agent, or Firm* — Muir Patent Law, PLLC

(57) ABSTRACT

A semiconductor package includes a first semiconductor chip, a second semiconductor chip attached to an upper surface of the first semiconductor chip, a silicon heat-dissipation body thermally connected to at least one of the first semiconductor chip and the second semiconductor chip, and a molding member configured to surround the first semiconductor chip and the second semiconductor chip and exposing an upper surface of the silicon heat-dissipation body.

20 Claims, 15 Drawing Sheets

(56) References Cited

U.S. PATENT DOCUMENTS

2016/0093598 A1* 3/2016 Jo et al. .................. H01L 25/18
  257/713
2018/0076174 A1   3/2018 Costa et al.

* cited by examiner

SEMICONDUCTOR PACKAGE AND METHOD OF MANUFACTURING THE SAME

CROSS-REFERENCE TO RELATED APPLICATION

This application claims the benefit of Korean Patent Application No. 10-2018-0146611, filed on Nov. 23, 2018, in the Korean Intellectual Property Office, the disclosure of which is incorporated herein in its entirety by reference.

BACKGROUND

The inventive concept relates to a semiconductor package and a method of manufacturing the same, and more particularly, to a semiconductor package, which has excellent heat dissipation characteristics and high reliability and may be manufactured using a simple process and a method of manufacturing the same.

Since a logic chip typically generates a large amount of heat during operation, the performance of the logic chip may be limited due to temperature. Accordingly, improvements are required in connection with heat dissipation of a semiconductor package including a logic chip.

SUMMARY

The inventive concept provides a semiconductor package, which has excellent heat dissipation characteristics and high reliability and may be manufactured using a simple process.

The inventive concept also provides a method of manufacturing a semiconductor package having excellent heat dissipation characteristics and high reliability using a simple process.

Furthermore, the inventive concept provides an electronic system including the semiconductor package.

According to an aspect of the inventive concept, there is provided a semiconductor package including a first semiconductor chip, a second semiconductor chip attached to an upper surface of the first semiconductor chip, a silicon heat-dissipation body thermally connected to at least one of the first semiconductor chip and the second semiconductor chip, and a molding member configured to surround the first semiconductor chip and the second semiconductor chip and expose an upper surface of the silicon heat-dissipation body. The silicon heat-dissipation body is not electrically connected to any one of the first semiconductor chip and the second semiconductor chip included in the semiconductor package.

According to another aspect of the inventive concept, there is provided a semiconductor package including a package substrate, a logic chip mounted on the package substrate, at least one memory chip attached to the logic chip, a molding member configured to encapsulate the logic chip and the memory chip, and a silicon heat-dissipation body adhered to the upper surface of the logic chip, the silicon heat-dissipation body having at least a portion exposed to the outside of the package.

According to another aspect of the inventive concept, there is provided a method of manufacturing a semiconductor package. The method includes mounting a logic chip on a package substrate, adhering a memory chip to the logic chip on an exposes portion of the upper surface of the logic chip, adhering a silicon heat-dissipation body to the upper surface of the logic chip, and forming a molding member to encapsulate the logic chip and the memory chip while leaving an upper surface of the silicon heat-dissipation body exposed to the outside of the package.

According to another aspect of the inventive concept, there is provided an electronic system including one or more of a controller, an input/output (I/O) circuit configured to input or output data, a memory configured to store data, an interface configured to be capable of transmitting and receiving data to and from an external device, and a bus configured to connect the controller, the I/O circuit, the memory, and/or the interface such that the controller, the I/O circuit, the memory, and/or the interface communicate with each other. The controller and the memory may be connected within a semiconductor package having a silicon heat-dissipation body.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
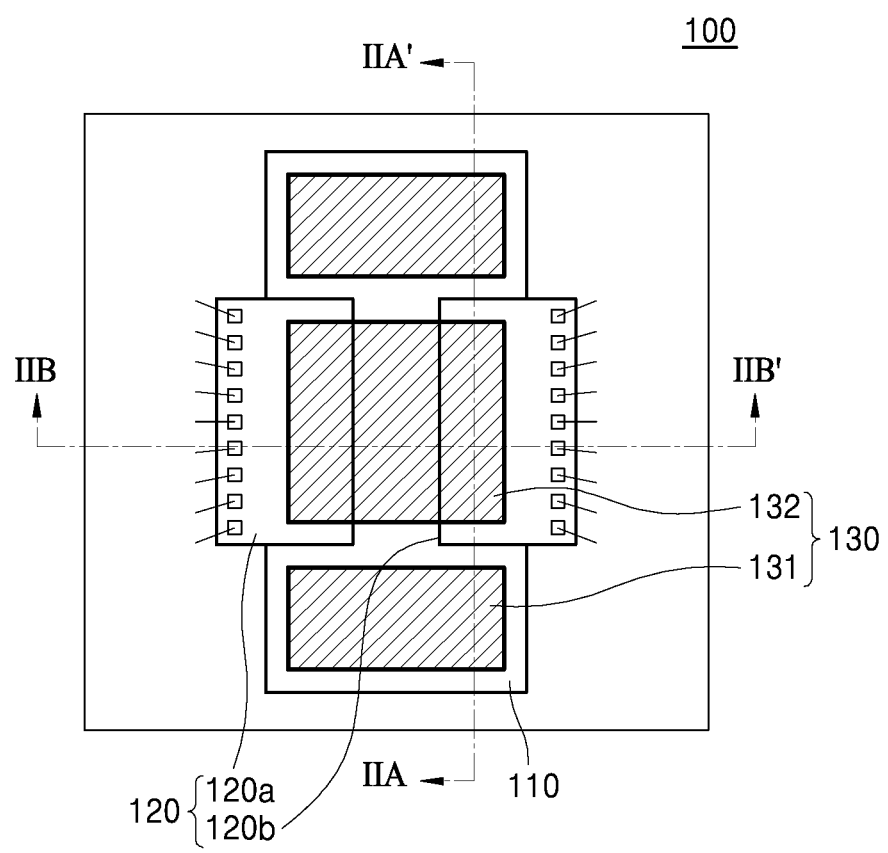
FIG. 1 is a plan view of a semiconductor package according to an embodiment.
Figure 2A:
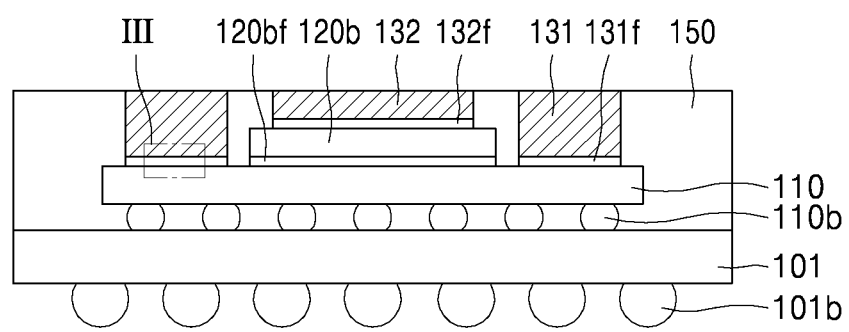
FIG. 2A is a cross-sectional view of a semiconductor package, which is taken along line IIA-IIA' of FIG. 1.
Figure 2B:
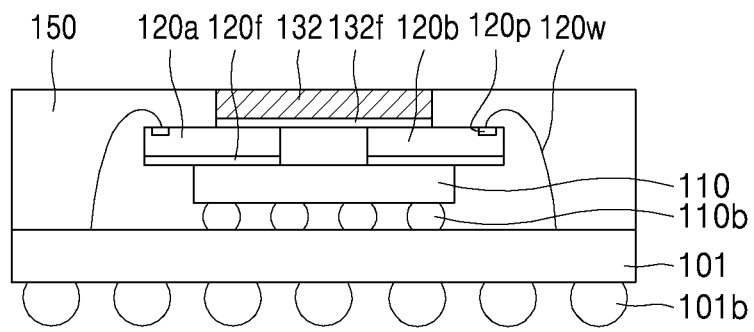
FIG. 2B is a cross-sectional view of a semiconductor package, which is taken along line IIB-IIB' of FIG. 1.

FIG. 1 is a plan view of a semiconductor package 100 according to an embodiment. FIG. 2A is a cross-sectional view of the semiconductor package 100, which is taken along line IIA-IIA' of FIG. 1. FIG. 2B is a cross-sectional view of the semiconductor package 100, which is taken along line IIB-IIB' of FIG. 1.

Referring to FIGS. 1, 2A, and 2B, the semiconductor package 100 comprises a first semiconductor chip 110 mounted on a package substrate 101. One or more second semiconductor chips 120 are located on the first semiconductor chip 110. Also, one or more silicon heat-dissipation bodies 130 are thermally connected to at least one of the first semiconductor chip 110 and the second semiconductor chip 120. In this example, the silicon heat-dissipation bodies 130 comprise first silicon heat-dissipation bodies 131 and a second silicon heat-dissipation body 132. The first semiconductor chip 110, the second semiconductor chips 120, and the first and second silicon heat-dissipation bodies 131 and 132 may be surrounded by a molding member 150. Portions of the first and second silicon heat-dissipation bodies 131 and 132 may be exposed with respect to the molding member 150.

The package substrate 101 may include, for example, a printed circuit board (PCB). In some embodiments, the package substrate 101 may include a multi-layer PCB. The package substrate 101 may include a base board layer, a top pad and a bottom pad respectively formed on an upper surface and a lower surface of the base board layer, and a solder resist layer configured to expose the top pad and the bottom pad.

In some embodiments, the base board layer may include at least one material selected out of a phenol resin, an epoxy resin, and polyimide. For example, the base board layer may include at least one material selected out of flame retardant 4 (FR4), tetrafunctional epoxy, polyphenylene ether, epoxy/polyphenylene oxide, bismaleimide triazine (BT), Thermount, cyanate ester, polyimide, and a liquid crystal polymer.

An interconnection pattern and a conductive via may be provided on the upper surface and the lower surface of the base board layer and/or inside the base board layer. The interconnection pattern may electrically connect the top pad to the bottom pad, and the conductive via may electrically connect interconnection patterns. An interconnection pattern may include, for example, electrolytically deposited (ED) copper foil, rolled-annealed (RA) copper foil, stainless steel foil, aluminum foil, ultra-thin copper foil, sputtered copper, and/or a copper alloy. The conductive via may be formed to penetrate at least a portion of the base board layer. In some embodiments, the conductive via may include copper, nickel, stainless steel, or beryllium copper.

Terminals 101b may be provided on the bottom pad to electrically connect the package substrate 101 to an external device. The terminals 101b may be, for example, bumps, solder balls, or conductive filler. For example, the terminals 101b may include tin (Sn) as a main component and include a material selected out of silver (Ag), copper (Cu), gold (Au), zinc (Zn), bismuth (Bi), indium (In), lead (Pb), chromium (Cr), platinum (Pt), tungsten (W), titanium (Ti), iridium (Ir), nickel (Ni), cobalt (Co), iron (Fe), phosphorus (P), and an alloy thereof, but the inventive concept is not limited thereto.

The first semiconductor chip 110 may be a logic chip. For example, the first semiconductor chip 110 may be a baseband chip (e.g., a modem chip), a central processing unit (CPU) chip, a graphics processing unit (GPU) chip, or an application processor (AP) chip.

The first semiconductor chip 110 may be flip-chip mounted on the package substrate 101. In this case, an active surface of the first semiconductor chip 110 may face the package substrate 101, and the first semiconductor chip 110 may be electrically connected to the package substrate 101 by chip connection members 110b.

The chip connection members 110b may be, for example, bumps, solder balls, or conductive filler. For example, the chip connection members 110b may include tin (Sn) as a main component and include a material selected out of silver (Ag), copper (Cu), gold (Au), zinc (Zn), bismuth (Bi), indium (In), lead (Pb), chromium (Cr), platinum (Pt), tungsten (W), titanium (Ti), iridium (Ir), nickel (Ni), cobalt (Co), iron (Fe), phosphorus (P), and an alloy thereof, but the inventive concept is not limited thereto.

In some embodiments, an under-fill layer may be further provided under the first semiconductor chip 110. The under-fill layer may be formed by a capillary under-fill method using an epoxy resin. In another embodiment, the under-fill layer may be formed using a non-conductive film (NCF).

Each of the second semiconductor chips 120 may be a memory chip. For example, each second semiconductor chip 120 may be a dynamic random access memory (DRAM) chip, a static RAM (SRAM) chip, a flash memory chip, an electrically erasable and programmable read-only memory (EEPROM) chip, a phase-change RAM (PRAM) chip, a magnetic RAM (MRAM) chip, or a resistive RAM (RRAM) chip. Specifically, the second semiconductor chips 120 may include a plurality of memory chips, for example, first and second memory chips 120a and 120b. The first and second memory chips 120a and 120b may be arranged in a lateral direction as shown in FIGS. 1 and 2B, but it will be understood to one skilled in the art that the first and second memory chips 120a and 120b may be stacked in a vertical direction. Also, the first memory chip 120a and the second memory chip 120b may be arranged such that active surfaces of the first and second memory chips 120a and 120b face upward, that is, face the silicon heat-dissipation body 132 to be described below. That is, the first memory chip 120a and the second memory chip 120b may be oriented such that the active surfaces of the first and second memory chips 120a and 120b face away from the first semiconductor chip 110.

In some embodiments, an end portion of the first memory chip 120a and/or an end portion of the second memory chip 120b may overhang chips (or interposers) on which they are mounted and form overhang portions. Here, such overhang portions protrude past side surfaces of the first semiconductor chip 110. Bonding pads 120p to be connected to the package substrate 101 may be provided in the overhang portions of the first memory chip 120a and/or the second memory chip 120b. Semiconductor devices in the first memory chip 120a and/or the second memory chip 120b may be electrically connected to the package substrate 101 through the bonding pads 120p. The bonding pads 120p may be electrically connected to the package substrate 101 through bonding wires 120w.

The bonding wires 120w may include gold (Au), copper (Cu), palladium (Pd), silver (Ag), platinum (Pt), aluminum (Al), beryllium (B), yttrium (Y), zirconium (Zr), calcium (Ca), nickel (Ni), iron (Fe), cobalt (Co), bismuth (Bi), phosphorus (P), ruthenium (Ru), rhodium (Rh), and an alloy of at least two thereof, but is not limited thereto.

The first memory chip 120a and the second memory chip 120b may be electrically connected to the first semiconductor chip 110 through the bonding wires 120w and the package substrate 101 and transmit and receive electric signals to and from the first semiconductor chip 110.

The first memory chip 120a and the second memory chip 120b may be adhered to the first semiconductor chip 110 using a die-attach film (DAF) 120f.

The first and second silicon heat-dissipation bodies 131 and 132 may be thermally connected to at least one of the first semiconductor chip 110 and the second semiconductor chip 120. It will be understood that when two objects are referred to as being "thermally connected" to each other, heat may be transmitted from one object to another object without a thermal insulator intervening between and separating the two objects. For example, when heat is transmitted from one object to another object without an intervening material (e.g., air) having a thermal conductivity of 0.05 W/(mK) or lower, 0.08 W/(mK) or lower, or 0.1 W/(mK) or lower interposed between to separate the two objects, the two objects may be referred to as being thermally connected to each other.

In some embodiments, the first silicon heat-dissipation bodies 131 may not be connected to any one of the first semiconductor chip 110 and the second semiconductor chips 120 by an electrically conductive interconnection (e.g., a metal interconnection). In some embodiments, the second silicon heat-dissipation body 132 may not be connected to any one of the first semiconductor chip 110 and the second semiconductor chips 120 by an electrically conductive interconnection (e.g., a metal interconnection). Here, it will be understood that when the first silicon heat-dissipation bodies 131 and/or the second silicon heat-dissipation body 132 are not connected to any one of the first semiconductor chip 110 and the second semiconductor chips 120 by electrically conductive interconnections, there are no electrically conductive interconnections configured to connect the first silicon heat-dissipation bodies 131 and/or the second silicon heat-dissipation body 132 to the first semiconductor chip 110 or the second semiconductor chips 120.

The first and second silicon heat-dissipation bodies 131 and 132 may be single crystalline silicon or polycrystalline silicon (poly-Si). Although the first and second silicon heat-dissipation bodies 131 and 132 may be more inexpensive than silver (Ag), the first and second silicon heat-dissipation bodies 131 and 132 may have thermal conductivity similar to that of silver (Ag). In addition, the first and second silicon heat-dissipation bodies 131 and 132 may be easily adhered to the first and second semiconductor chips 110 and 120 by DAFs as will be described in detail below.

In some embodiments, the first silicon heat-dissipation bodies 131 may be thermally connected to the first semiconductor chip 110, and the second silicon heat-dissipation body 132 may be thermally connected to the second semiconductor chips 120. The first silicon heat-dissipation bodies 131 may vertically extend from an upper surface of the first semiconductor chip 110 to an upper surface of the semiconductor package 100. The second silicon heat-dissipation body 132 may vertically extend from upper surfaces of the second semiconductor chips 120 to the upper surface of the semiconductor package 100.

Upper surface of the first silicon heat-dissipation bodies 131 may be substantially coplanar with an upper surface of the second silicon heat-dissipation body 132. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

For example, as shown in FIG. 2B, the second silicon heat-dissipation body 132 may extend in a lateral direction across an upper surface of the first memory chip 120a and an upper surface of the second memory chip 120b. The second silicon heat-dissipation body 132 may extend in a lateral direction from the upper surface of the first memory chip 120a to the upper surface of the second memory chip 120b without invading a region in which the bonding pad 120p is formed. As described below, a space between the first memory chip 120a and the second memory chip 120b may be filled with the molding member 150, and the second silicon heat-dissipation body 132 may be supported by the molding member 150 between the first memory chip 120a and the second memory chip 120b.

The first silicon heat-dissipation bodies 131 and the second silicon heat-dissipation body 132 may be adhered to the first semiconductor chip 110 and the second semiconductor chips 120 by DAFs 131f and 132f, respectively.

Figure 3:
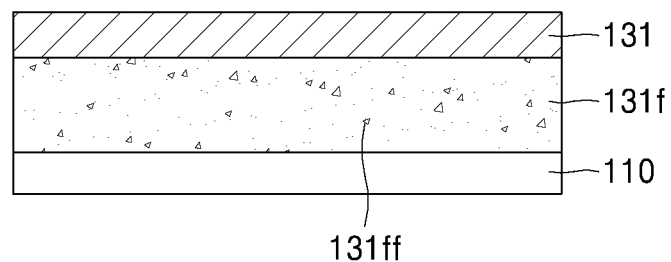
FIG. 3 is an enlarged view of region III of FIG. 2A, specifically illustrating a die-attach film (DAF)

FIG. 3 is an enlarged view of region III of FIG. 2A, illustrating exemplary details of the DAF 131f.

Referring to FIG. 3, the first silicon heat-dissipation body 131 may be adhered to the first semiconductor chip 110 using the DAF 131f. In some embodiments, the DAF 131f may include be thermal DAF. The thermal DAF may include filler 131ff dispersed in a matrix.

The filler 131ff may include a material having a higher thermal conductivity than the matrix. For example, the filler may have a thermal conductivity of 30 W/(mK) or greater. For example, the filler 131ff may include carbon-based nano-powder, inorganic powder, metal powder, or a mixture thereof, but is not limited thereto. Since filler 131ff (e.g., alumina ($Al_2O_3$) powder) having a high thermal conductivity (i.e., a high dielectric constant (k)) are dispersed in the DAF 131f, the DAF 131f may exhibit better heat transmission characteristics than a typical DAF.

The DAF 131f may have a thickness of about 8 μm to about 30 μm. As shown in FIG. 3, a single layer of DAF 131f may contact the lower surface of a corresponding first silicon heat-dissipation body 131 and an upper surface of the first semiconductor chip 110 to attach the same to each other. (DAFs described elsewhere herein may similarly contact corresponding surfaces of the various related structures to attach the same.)

Referring back to FIGS. 1, 2A, and 2B, an exposed surface area (e.g., upper surface) of the second silicon heat-dissipation body 132 may be larger than an exposed surface area (e.g., upper surface) of each of the first silicon heat-dissipation bodies 131. Shapes and dimensions of respective components shown in FIG. 1 may be exaggerated for clarity, and actual shapes and dimensions of the first silicon heat-dissipation bodies 131 and the second silicon heat-dissipation body 132 are not limited to those shown in FIG. 1. In some embodiments, the exposed surface area of one or both of the first silicon heat-dissipation bodies 131 may be larger than the exposed surface area of the second silicon heat-dissipation body 132.

The molding member 150 may include an epoxy molding compound (EMC), but is not specifically limited thereto. The molding member 150 may also include filler, which may include a material having a higher thermal conductivity than the EMC.

The molding member 150 may surround side surfaces of the first semiconductor chip 110 and the second semiconductor chips 120. Also, the molding member 150 may surround side surfaces of the first silicon heat-dissipation bodies 131 and the second silicon heat-dissipation body 132. Meanwhile, upper surfaces of the first silicon heat-dissipation bodies 131 and the second silicon heat-dissipation body 132 may be exposed with respect to the molding member 150.

In some embodiments, the upper surfaces of the first silicon heat-dissipation bodies 131 and the second silicon heat-dissipation body 132 and an upper surface of the molding member 150 may be substantially coplanar with each other. The filler may include carbon-based nano-powder, inorganic powder, metal powder, or a mixture thereof, but is not limited thereto.

Figure 4:
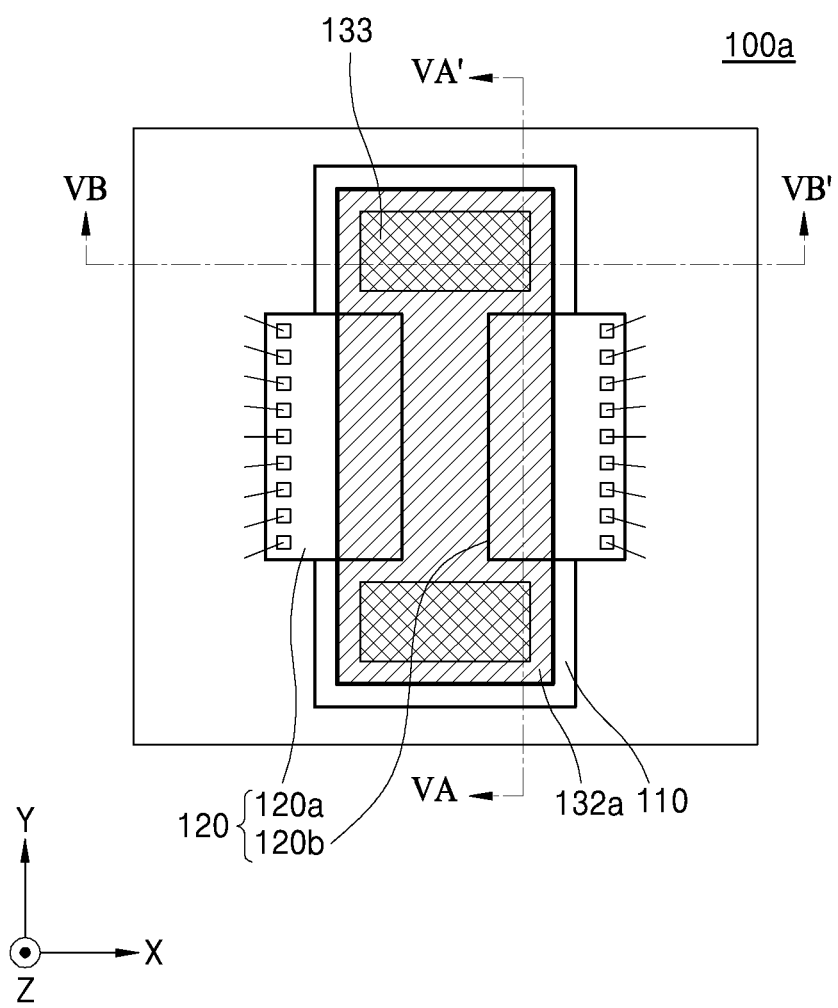
FIG. 4 is a plan view of a semiconductor package according to an embodiment.
Figure 5A:
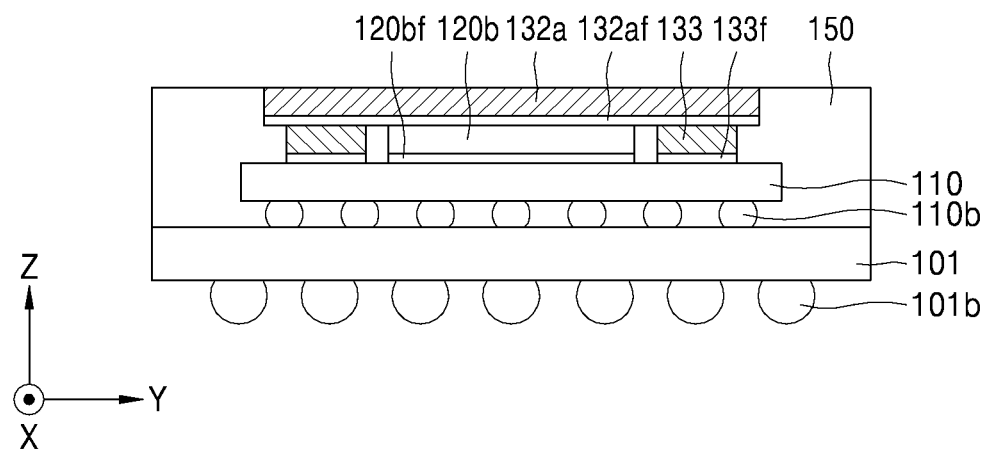
FIG. 5A is a cross-sectional view of a semiconductor package, which is taken along line VA-VA' of FIG. 4.
Figure 5B:
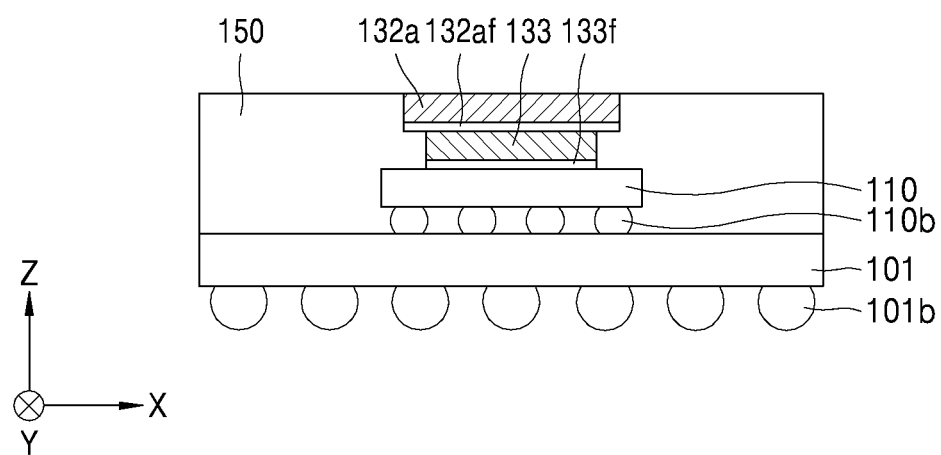
FIG. 5B is a cross-sectional view of a semiconductor package, which is taken along line VB-VB' of FIG. 4.

FIG. 4 is a plan view of a semiconductor package 100a according to an embodiment. FIG. 5A is a cross-sectional view of the semiconductor package 100a, which is taken along line VA-VA' of FIG. 4. FIG. 5B is a cross-sectional view of the semiconductor package 100a, which is taken along line VB-VB' of FIG. 4.

The embodiment shown in FIGS. 4, 5A, and 5B may differ from the embodiment described with reference to FIGS. 1, 2A, and 2B in terms of configurations of a second silicon heat-dissipation body 132a and a third silicon heat-dissipation body 133. Accordingly, repetitive descriptions may be omitted below, and differences will mainly be described.

Referring to FIGS. 4, 5A, and 5B, the second silicon heat-dissipation body 132a may be connected to upper surfaces of first and second memory chips 120a and 120b. The second silicon heat-dissipation body 132a may extend in a +Y direction and a −Y direction and extend over the upper surface of the first semiconductor chip 110 in a lateral direction. The second silicon heat-dissipation body 132a may be formed on the upper surfaces of the second memory chips 120.

Since an area of the second silicon heat-dissipation body 132a is larger than an area of each of the second semiconductor chips 120, heat generated by the second semiconductor chips 120 may be discharged relatively smoothly.

In some embodiments, third silicon heat-dissipation bodies 133 may be provided under extended portions of the second silicon heat-dissipation body 132a, which may extend past the upper surfaces of the second memory chips 120. The third silicon heat-dissipation bodies 133 may vertically extend in a Z direction from the upper surface of the first semiconductor chip 110 to a lower surface of the second silicon heat-dissipation body 132a and thermally connect the same.

When the first semiconductor chip 110 is a logic chip, a large amount of heat may be generated in a short amount of time. In this case, heat may be smoothly dissipated to the outside through the third silicon heat-dissipation bodies 133 and the second silicon heat-dissipation body 132a. When the third silicon heat-dissipation body 133 is not used, heat generated by the first semiconductor chip 110 may be discharged through the second semiconductor chips 120 and the second silicon heat-dissipation body 132a. In this case, heat dissipation efficiency may be degraded, and the second semiconductor chip 120 may be damaged due to heat.

A material of the third silicon heat-dissipation bodies 133 and a method of adhering the third silicon heat-dissipation body 133 may be the same as those of the first and second silicon heat-dissipation bodies 131 and 132 described with reference to FIG. 1, and repetitive descriptions thereof may be omitted.

Figure 6:
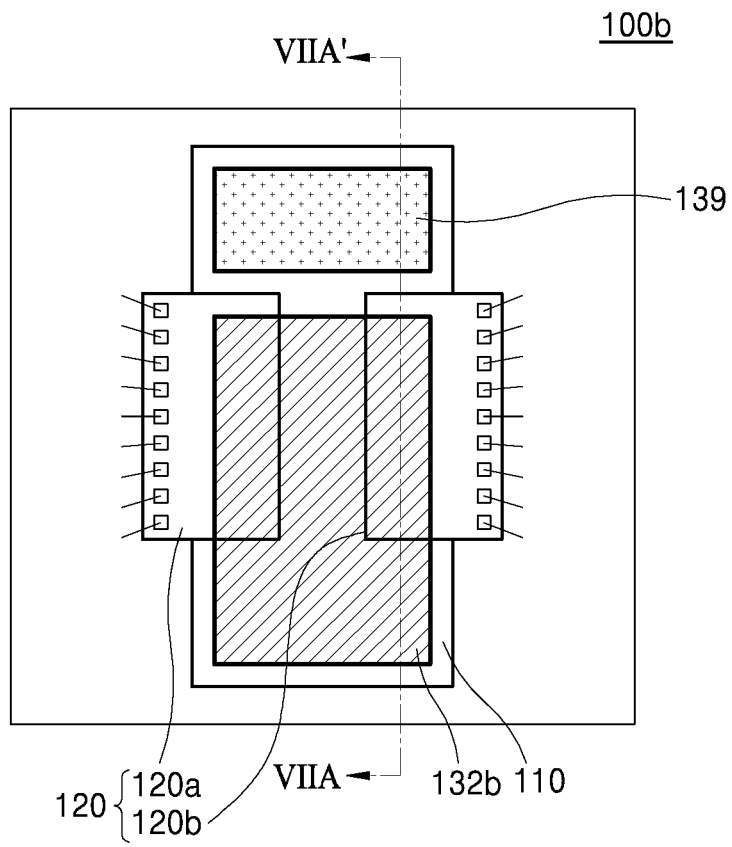
FIG. 6 is a plan view of a semiconductor package according to an embodiment.
Figure 7:
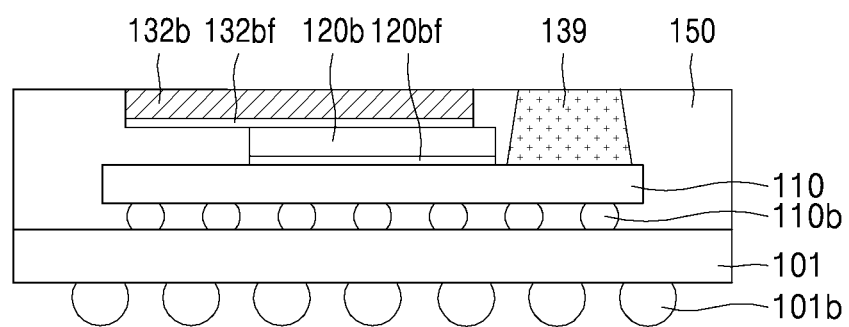
FIG. 7 is a cross-sectional view of a semiconductor package, which is taken along line VIIA-VIIA' of FIG. 6.

FIG. 6 is a plan view of a semiconductor package 100b according to an embodiment. FIG. 7 is a cross-sectional view of the semiconductor package 100b, which is taken along line VIIA-VIIA' of FIG. 6.

The embodiment shown in FIGS. 6 and 7 may differ from the embodiment described with reference to FIGS. 4, 5A, and 5B in that a configuration of a second silicon heat-dissipation body 132b is modified and a metal heat-dissipation body 139 is used. Accordingly, repetitive descriptions may be omitted below, and differences will mainly be described.

Referring to FIGS. 6 and 7, the second silicon heat-dissipation body 132b may be adhered to a second semiconductor chip 120 by a DAF 132bf. The second silicon heat-dissipation body 132b may extend in one lateral direction on the second semiconductor chip 120 and extend in a lateral direction over the upper surface of a first semiconductor chip 110. Meanwhile, the second silicon heat-dissipation body 132b may not extend beyond an upper surface of the second semiconductor chip 120 in an opposite lateral direction.

The semiconductor package 100b may include the metal heat-dissipation body 139 connected to the upper surface of the first semiconductor chip 110. The metal heat-dissipation body 139 may vertically extend from the upper surface of the first semiconductor chip 110 to an upper surface of the semiconductor package 100b.

The metal heat-dissipation body 139 may be formed of metal having a highly thermal conductivity. For instance, the metal heat-dissipation body 139 may be silver (Ag), aluminum (Al), copper (Cu), titanium (Ti), platinum (Pt), iron (Fe), cobalt (Co), nickel (Ni), zinc (Zn), or an alloy thereof.

The metal heat-dissipation body 139 may be adhered to an upper surface of the first semiconductor chip 110 using, for example, a thermal interface material (TIM). The TIM may be a paste material or a solid material capable of thermally bonding two objects to each other. For instance, the TIM may be thermal grease, a thermal adhesive, or a thermal pad, but the invention is not limited thereto.

In some embodiments, a lower horizontal width of the metal heat-dissipation body 139 may be greater than an upper horizontal width thereof. That is, the metal heat-dissipation body 139 may have a trapezoidal shape with respect to vertical cross section.

The first semiconductor chip 110 may include various semiconductor devices, and relatively high heat may be generated in a region that is crowded with semiconductor devices configured to serve a specific function. For example, the first semiconductor chip 110 may comprise a system on a chip (SoC), including a processor core and several physically separate functional modules. It may be necessary to rapidly dissipate heat generated in a region that is crowded with semiconductor devices configured to generate particularly high heat during operations (e.g., one or more of the functional modules of an SoC may be particularly susceptible to the generation of high heat when first semiconductor chip 110 is an SoC). Thus, the metal heat-dissipation body 139 having a high thermal conductivity may be used in a region in which rapid dissipation of heat of the first semiconductor chip 110 is particularly required (e.g., on regions of first semiconductor chip 110 having one or more functional modules of an SoC formed therein). In contrast, in other regions of the first semiconductor chip 110, for example, regions in which heat is generated during operations but the temperature rises at a relatively low rate, heat may be dissipated through the second semiconductor chip 120 and the second silicon heat-dissipation body 132b adhered to an upper portion of the second semiconductor chip 120.

Figure 8:
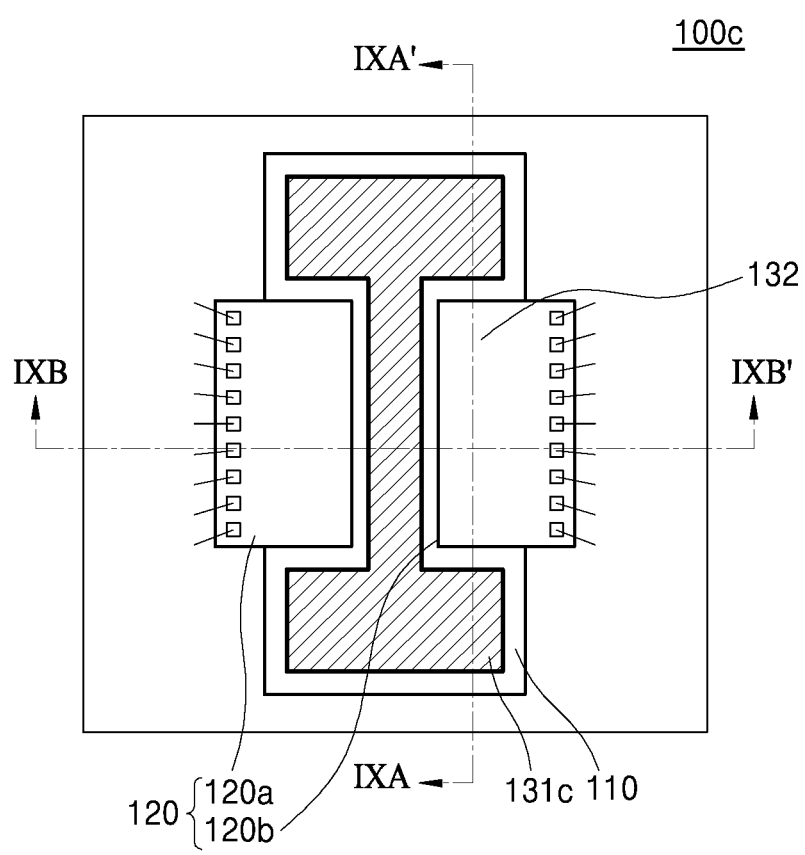
FIG. 8 is a plan view of a semiconductor package according to an embodiment.
Figure 9A:
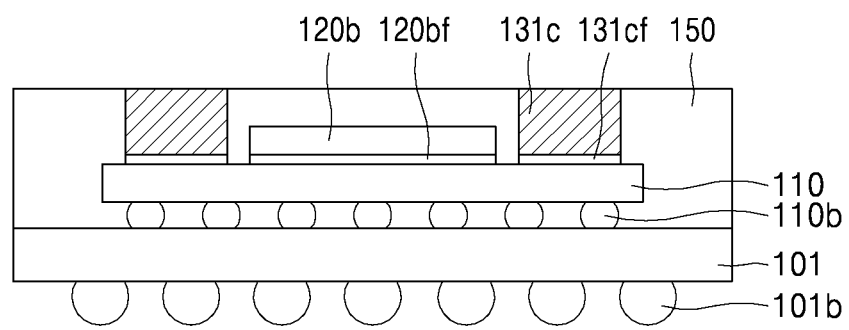
FIG. 9A is a cross-sectional view of a semiconductor package, which is taken along line IXA-IXA' of FIG. 8.
Figure 9B:
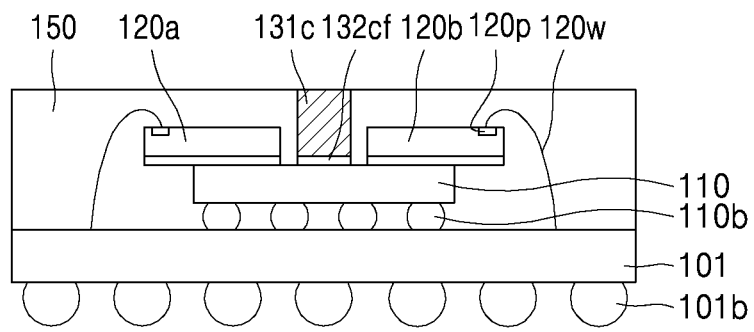
FIG. 9B is a cross-sectional view of a semiconductor package, which is taken along line IXB-IXB' of FIG. 8.

FIG. 8 is a plan view of a semiconductor package 100c according to an embodiment. FIG. 9A is a cross-sectional view of the semiconductor package 100c, which is taken along line IXA-IXA' of FIG. 8. FIG. 9B is a cross-sectional view of the semiconductor package 100c, which is taken along line IXB-IXB' of FIG. 8.

The embodiment shown in FIGS. 8, 9A, and 9B may differ from the embodiment described with reference to FIGS. 1, 2A, and 2B in that a second silicon heat-dissipation body is omitted and a configuration of a first silicon heat-dissipation body 131c is modified. Accordingly, repetitive descriptions may be omitted below, and differences will mainly be described.

Referring to FIGS. 8, 9A, and 9B, a silicon heat-dissipation body adhered to a second semiconductor chip 120 may be omitted. The first silicon heat-dissipation body 131c adhered to a first semiconductor chip 110 may not be in direct contact with the second semiconductor chip 120 but be in contact with an upper surface of the first semiconductor chip 110 over the largest possible area. The first silicon heat-dissipation body 131c may include DAF 131cf to adhere the first silicon heat-dissipation body 131c to the upper surface of the first semiconductor chip 110.

As shown in FIG. 8, the second semiconductor chips 120 may include a first memory chip 120a and a second memory chip 120b, which may be arranged in a lateral direction on the first semiconductor chip 110 and spaced a predetermined distance apart from each other. As a result, a path having a width corresponding to the predetermined distance may be formed between the first memory chip 120a and the second memory chip 120b. The path may connect two relatively largely exposed upper surfaces of the first semiconductor chip 110.

The first silicon heat-dissipation body 131c may cover each of the two relatively largely exposed upper surfaces of the first semiconductor chip 110 over the largest possible area. Also, the first silicon heat-dissipation body 131c may cover a surface of the path to connect portions of the first silicon heat-dissipation body 131c on the two relatively largely exposed upper surfaces of the first semiconductor chip 110. As a result, the first silicon heat-dissipation body 131c may have a planar shape similar to an I shape.

While the first silicon heat-dissipation body 131c is passing through the path, side surfaces of the first silicon heat-dissipation body 131c may extend to face at least three side surfaces of each of the first memory chip 120a and the second memory chip 120b. That is, in FIG. 8, one side surface of the first silicon heat-dissipation body 131c may extend to face three side surfaces of the first memory chip 120a. Also, another side surface of the first silicon heat-dissipation body 131c may extend to face three side surfaces of the second memory chip 120b.

Heat generated by the second semiconductor chips 120 (i.e., the first memory chip 120a and the second memory chip 120b) may be dissipated to the outside through a molding member 150. Meanwhile, heat generated by the first semiconductor chip 110 may be dissipated to the outside through the first silicon heat-dissipation body 131c. To maximize a contact area between the first semiconductor chip 110 and the first heat-dissipation body 131c, the first semiconductor chip 110 and the second semiconductor chip 120 shown in FIG. 8 may be arranged so that the first silicon heat-dissipation body 131c may have the planar shape similar to the I shape. The maximized contact area may enable efficient dissipation of heat generated by the first semiconductor chip 110.

Furthermore, heat generated by a portion of the first semiconductor chip 110, which is covered by the second semiconductor chip 120, may be dissipated to the outside through the second semiconductor chip 120 and the molding member 150. It can be appreciated that portions of molding member 150 interposed between the second semiconductor chips 120 and the first silicon heat-dissipation body 131c may be made thin, such as thinner than the thickness of the molding member 150 disposed above the second semiconductor chips 120.

When the first semiconductor chip 110 is a logic chip, a large amount of heat may be generated in a short amount of time at a relatively uniform rate over the entire region of the first semiconductor chip 110. In this case, heat generated by the first semiconductor chip 110 may be smoothly dissipated to the outside through the first silicon heat-dissipation body 131c.

Figure 10:
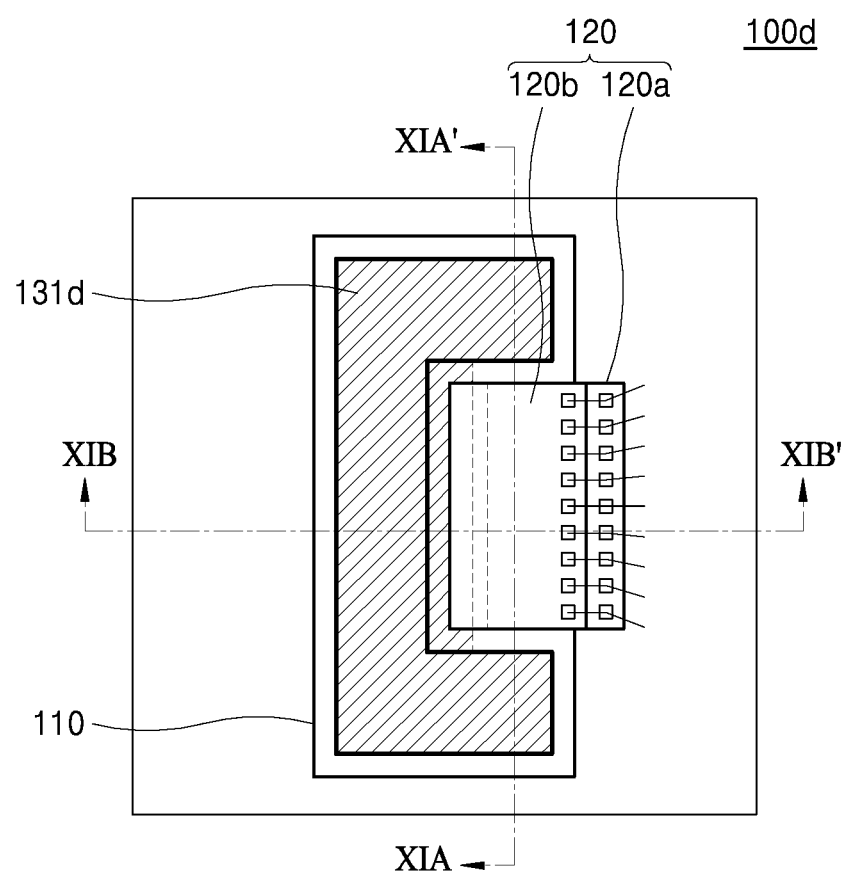
FIG. 10 is a plan view of a semiconductor package according to an embodiment.
Figure 11A:
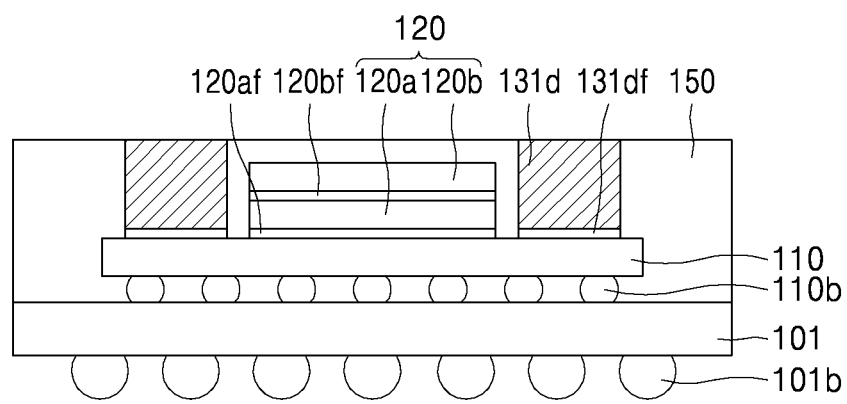
FIG. 11A is a cross-sectional view of a semiconductor package, which is taken along line XIA-XIA' of FIG. 10.
Figure 11B:
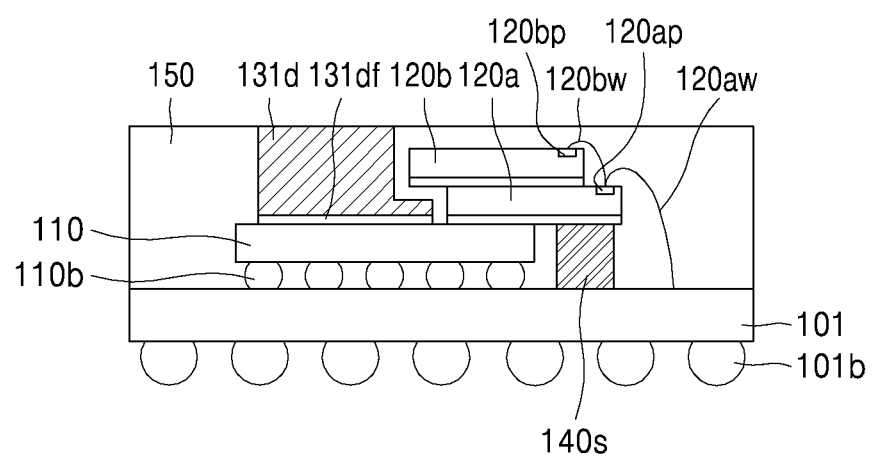
FIG. 11B is a cross-sectional view of a semiconductor package, which is taken along line XIB-XIB' of FIG. 10.

FIG. 10 is a plan view of a semiconductor package 100d according to an embodiment. FIG. 11A is a cross-sectional view of the semiconductor package 100d, which is taken along line XIA-XIA' of FIG. 10. FIG. 11B is a cross-sectional view of the semiconductor package 100d, which is taken along line XIB-XIB' of FIG. 10.

The embodiment shown in FIGS. 10, 11A, and 11B may differ from the embodiment described with reference to FIGS. 8, 9A, and 9B in terms of the arrangement of second semiconductor chips 120 and a configuration of a first silicon heat-dissipation body 131d. Accordingly, repetitive descriptions may be omitted below, and differences will mainly be described.

Referring to FIGS. 10, 11A, and 11B, the second semiconductor chips 120 may include a first memory chip 120a and a second memory chip 120b, which may be stacked in a vertical direction. Specifically, the first memory chip 120a and the second memory chip 120b may be stacked in a slightly offset manner to expose the bonding pad 120ap of the first memory chip 120a to assist in a wire bonding process.

Specifically, the first memory chip 120a may be adhered to a first semiconductor chip 110 using a DAF 120af. Also, the second memory chip 120b may be adhered to the first memory chip 120a using a DAF 120bf.

A bonding pad 120bp of the second memory chip 120b may be electrically connected to the first memory chip 120a through a bonding wire 120bw. Also, the bonding pad 120ap of the first memory chip 120a may be electrically connected to a package substrate 101 through a bonding wire 120aw.

Since the first memory chip 120a and the second memory chip 120b are stacked in the slightly offset manner, a space in which the first memory chip 120a is retreated may be formed under one side portion of the second memory chip 120b.

The first silicon heat-dissipation body 131d may be connected to an upper surface of the first semiconductor chip 110. The first silicon heat-dissipation body 131d may be adhered to the upper surface of the first semiconductor chip 110 by a die-attach pad 131df. As described above, the die-attach pad 131df may include a thermal DAF including filler.

The first silicon heat-dissipation body 131d may partially surround a circumference of the second semiconductor chip 120. In some embodiments, the first silicon heat-dissipation body 131d may surround three side surfaces of the first memory chip 120a and the second memory chip 120b. Also, the first silicon heat-dissipation body 131d may vertically extend from the upper surface of the first semiconductor chip 110 to an upper surface of the semiconductor package 100d.

A portion of the first silicon heat-dissipation body 131d may extend under an overhang portion of the second memory chip 120b toward the first memory chip 120a. Thus, the first silicon heat-dissipation body 131d may form an L-shaped structure (refer to FIG. 11B). The portion of the first silicon heat-dissipation body 131d that extends toward the first memory chip 120a may be inserted into a space in which the first memory chip 120a is retreated. As a result, the upper surface of the portion of the first silicon heat-dissipation body 131d that extends toward the first memory chip 120a may face a bottom surface of the second memory chip 120b.

A support structure 140s configured to support an overhang portion may be provided under the first memory chip 120a. The support structure 140s may be silicon (e.g., crystalline silicon), an EMC, and/or another arbitrary material having an electrical insulation characteristic.

Figure 12:
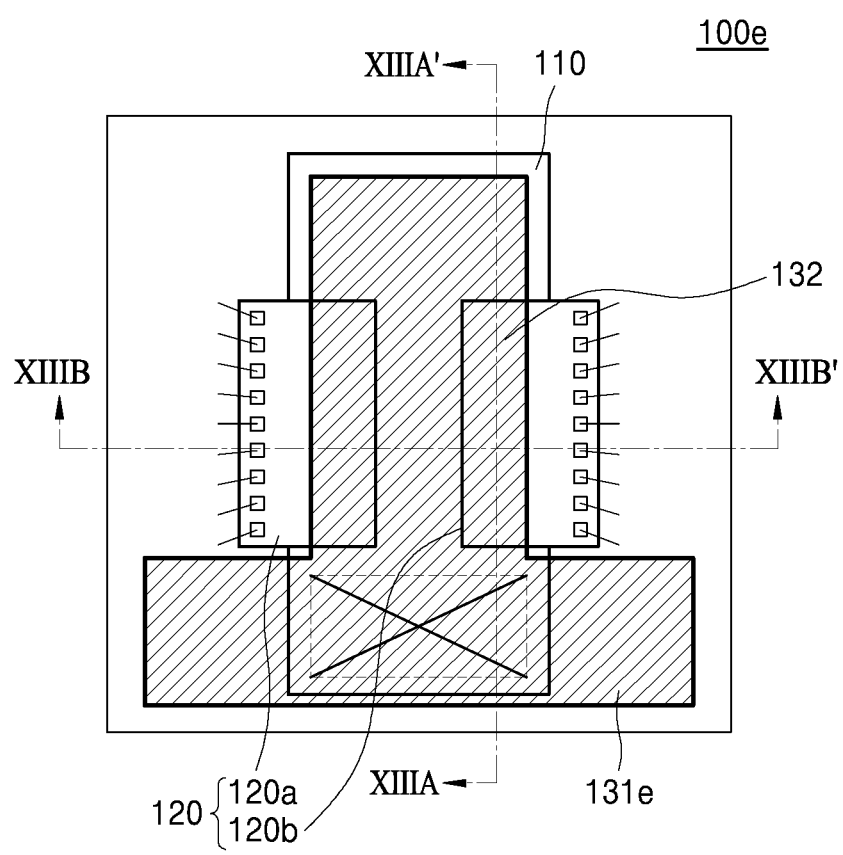
FIG. 12 is a plan view of a semiconductor package according to an embodiment.
Figure 13A:
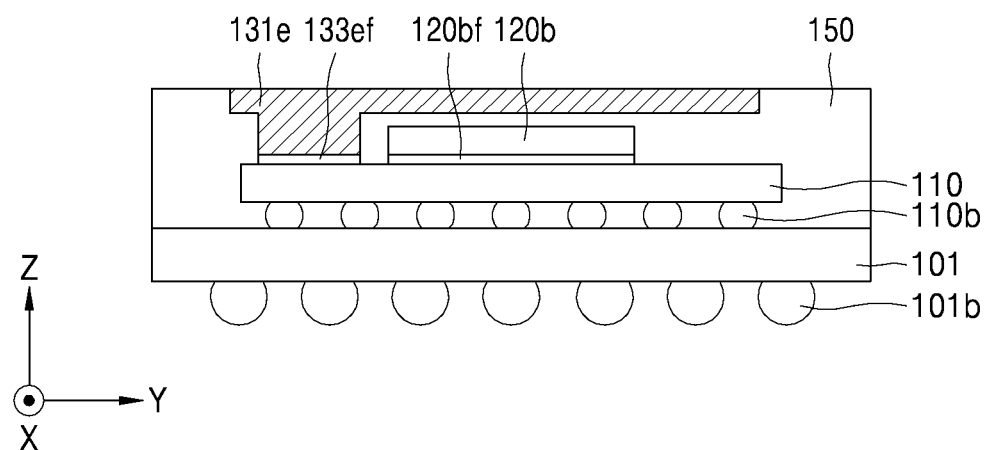
FIG. 13A is a cross-sectional view of a semiconductor package, which is taken along line XIIIA-XIIIA' of FIG. 4.
Figure 13B:
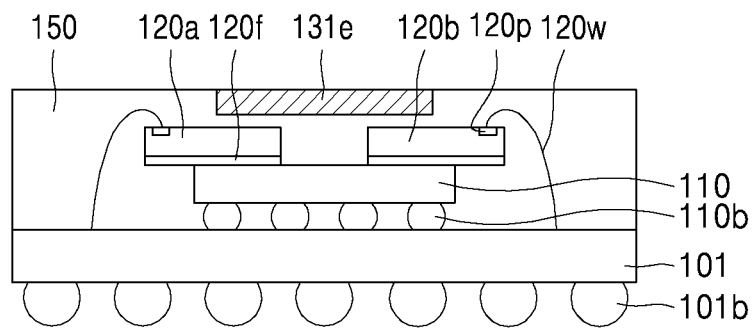
FIG. 13B is a cross-sectional view of a semiconductor package, which is taken along line XIIIB-XIIIB' of FIG. 4.

FIG. 12 is a plan view of a semiconductor package 100e according to an embodiment. FIG. 13A is a cross-sectional view of the semiconductor package 100e, which is taken along line XIIIA-XIIIA' of FIG. 4. FIG. 13B is a cross-sectional view of the semiconductor package 100e, which is taken along line XIIIB-XIIIB' of FIG. 4.

The embodiment shown in FIGS. 12, 13A, and 13B may differ from the embodiment described with reference to FIGS. 8, 9A, and 9B in terms of a configuration of a first silicon heat-dissipation body 131e. Accordingly, repetitive descriptions may be omitted below, and differences will mainly be described.

Referring to FIGS. 12, 13A, and 13B, the first silicon heat-dissipation body 131e may be adhered to an upper surface of the first semiconductor chip 110 by a die-attach pad 131ef.

The first silicon heat-dissipation body 131e may extend from the upper surface of the first semiconductor chip 110 to an upper surface of the semiconductor package 100e. A surface area of an upper surface of the first silicon heat-dissipation body 131e may be larger than a lower surface of the first silicon heat-dissipation body 131e. A vertical extension portion of the first silicon heat-dissipation body 131e may extend in a vertical direction from the lower surface of the first silicon heat-dissipation body 131e, and a horizontal extension portion of the first silicon heat-dissipation body 131e may extend in a lateral direction from the upper surface of the semiconductor package 100e. In some embodiments, the horizontal extension portion may extend in a lateral direction across the first memory chip 120a and the second memory chip 120b.

Since the first silicon heat-dissipation body 131e has a large upper surface, the first silicon heat-dissipation body 131e may have increased heat dissipation effects. In other words, since heat may be smoothly discharged from the upper surface of the first silicon heat-dissipation body 131e, the temperature of the lower surface of the first silicon heat-dissipation body 131e may be maintained relatively low so that the first semiconductor chip 110 may be effectively cooled.

Although the first silicon heat-dissipation body 131e is illustrated as an integrated type in FIG. 13A (e.g., continuous and monolithic), instead two or more silicon heat-dissipation members may be combined with each other by DAFs to form first silicon heat-dissipation body 131e.

Hereinafter, a method of manufacturing the semiconductor package 100 according to an embodiment will be described.

Figure 14A:
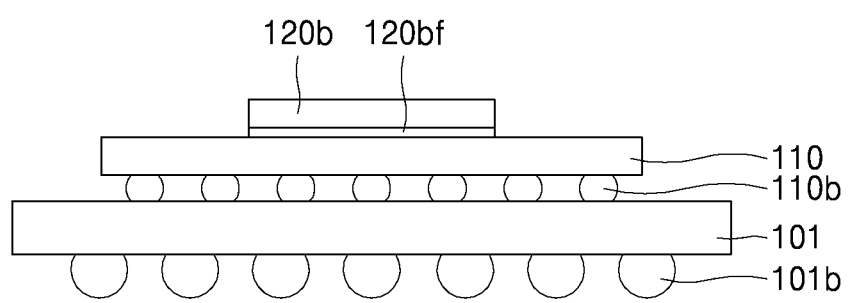
FIGS. 14A to 14C are cross-sectional views illustrating a method of manufacturing a semiconductor package, according to an embodiment.
Figure 14B:
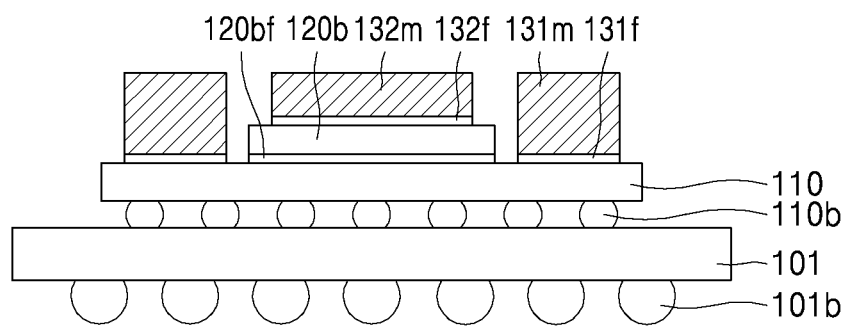
Figure 14C:
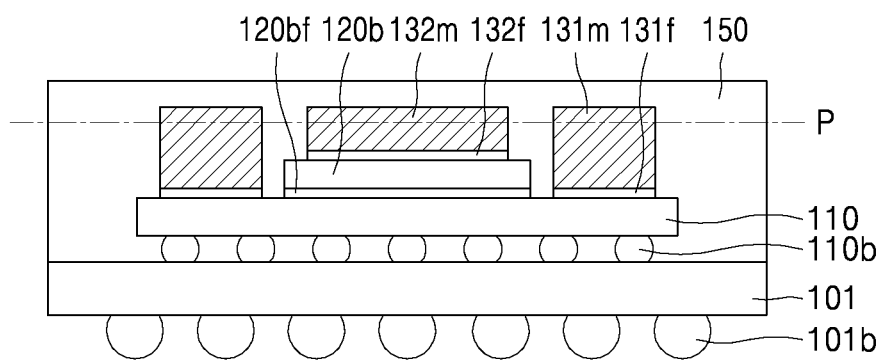

FIGS. 14A to 14C are cross-sectional views illustrating a method of manufacturing a semiconductor package 100, according to an embodiment.

Referring to FIG. 14A, a first semiconductor chip 110 may be mounted on a package substrate 101. The first semiconductor chip 110 may be mounted as a flip-chip type on the package substrate 101 as described with reference to FIGS. 1, 2A, and 2B, and repetitive detailed descriptions thereof will be omitted.

One or more second semiconductor chips may be adhered to the first semiconductor chip 110. Although a second memory chip 120b is illustrated as an example of a second semiconductor chip in FIG. 14A, the inventive concept is not limited thereto. The second memory chip 120b may be adhered to an upper surface of the first semiconductor chip 110 using a DAF 120bf.

Referring to FIG. 14B, silicon heat-dissipation bodies 131m and 132m may be adhered to the first semiconductor chip 110 and the second memory chip 120b. The silicon heat-dissipation bodies 131m and 132m may be adhered to the first semiconductor chip 110 and the second memory chip 120b using DAFs 131f and 132f, such as thermal DAFs.

Referring to FIG. 14C, the first semiconductor chip 110, the second memory chip 120b, and the silicon heat-dissipation bodies 131m and 132m may be molded with a molding member 150 to surround side surfaces and upper surfaces of the first semiconductor chip 110, the second memory chip 120b, and the silicon heat-dissipation bodies 131m and 132m.

For example, a molding method using the molding member 150 may be performed by injecting an EMC resin into a mold and curing the EMC resin, but the inventive concept is not limited thereto.

Thereafter, an upper portion of the molding member 150 may be removed, for example, along a line P, to expose the upper surfaces of the silicon heat-dissipation bodies 131m and 132m. Thus, the semiconductor package 100 according to the embodiment described with reference to FIGS. 1, 2A, and 2B may be obtained. The upper portion of the molding member 150 may be removed using, for example, a grinding process and a mechanical polishing process (e.g., by planarization, such as by chemical mechanical polishing (CMP)).

Figure 15A:
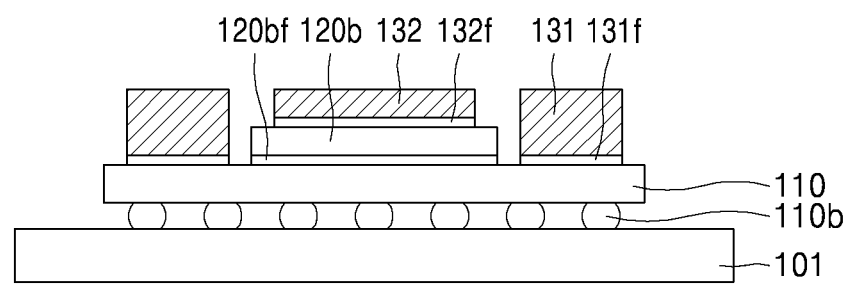
FIGS. 15A and 15B are cross-sectional views illustrating a method of manufacturing a semiconductor package, according to an embodiment.
Figure 15B:
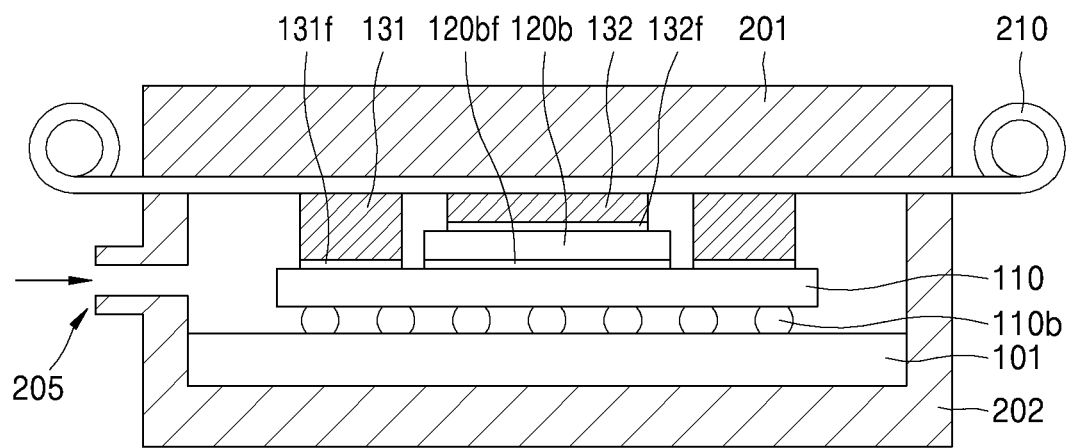

FIGS. 15A and 15B are cross-sectional views illustrating a method of manufacturing a semiconductor package 100, according to an embodiment.

Referring to FIG. 15A, a first semiconductor chip 110 and one or more second semiconductor chips (e.g., a second memory chip 120b) may be adhered to a package substrate 101, and silicon heat-dissipation bodies 131 and 132 may be adhered to the first semiconductor chip 110 and the second semiconductor chip. Since the process of FIG. 15A is the same as described with reference to FIGS. 14A and 14B, a detailed description thereof will be omitted.

Referring to FIG. 15B, upper surfaces of the silicon heat-dissipation bodies 131 and 132 may be brought into contact with a protective film 210 included in molds 201 and 202, and a molding resin (e.g., an EMC) may be then injected into the molds 201 and 202 and cured. The molding resin may be cured to form a molding member. A workpiece in which the molding resin is completely cured may be taken out from the molds 201 and 202, and the protective film 210 may be removed. As a result, the semiconductor package 100 according to the embodiment described with reference to FIGS. 1, 2A, and 2B may be obtained.

The semiconductor packages according to the embodiments described with reference to FIGS. 4 to 13B may be manufactured using the same method, and the embodiments may be easily performed by one skilled in the art as described with reference to FIGS. 14A to 15B. Semiconductor packages having excellent heat dissipation characteristics and high reliability may be manufactured using simple processes.

Figure 16:
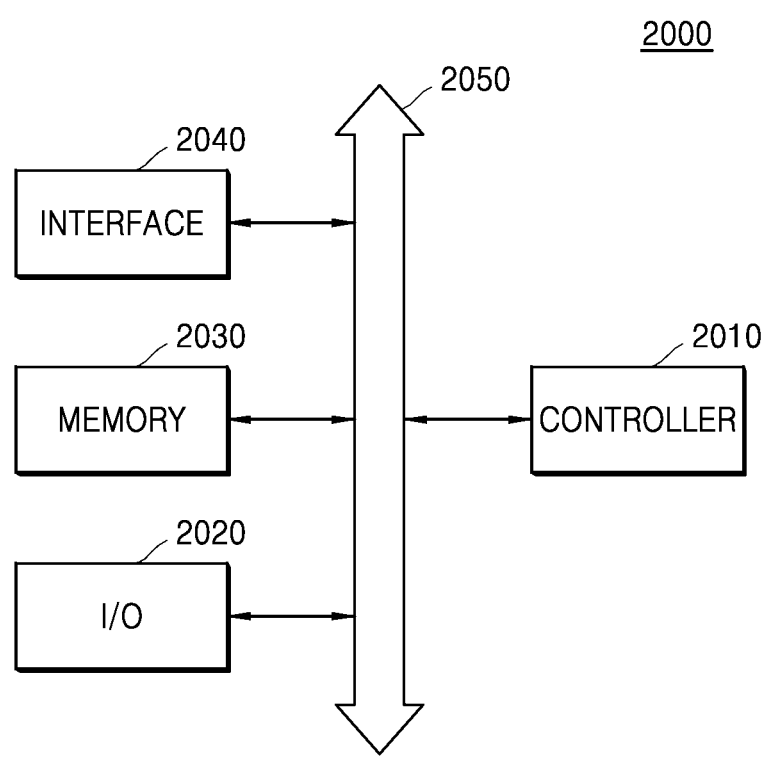
FIG. 16 is a block diagram of an electronic system according to an embodiment.

FIG. 16 is a block diagram of an electronic system 2000 according to an embodiment.

The electronic system 2000 may include a controller 2010, an input/output (I/O) circuit 2020 (e.g., input/output circuits, such as buffers), a memory 2030, and an interface 2040, which may be connected to each other through a bus 2050.

The controller 2010 may include at least one of a microprocessor, a digital signal processor, or a processor similar thereto. The interface 2040 may be user interface and may include at least one of a keypad, a keyboard, or a display device. The memory 2030 may be used to store a command executed by the controller 2010. For example, the memory 2030 may be used to store user data.

The electronic system 2000 may constitute a wireless communication device or a device capable of transmitting and/or receiving information in wireless environments. The interface 2040 may include a wireless interface so that the electronic system 2000 may transmit and receive data via a wireless communication network. The interface 2040 may include an antenna and/or a wireless transceiver. In some embodiments, the electronic system 2000 may be used for a communication interface protocol of a third-generation communication system, for example, code-division multiple access (CDMA), global system for mobile communications (GSM), north American digital cellular (NADC), extended-time division multiple access (E-TDMA), and/or wide band code division multiple access (WCDMA). The electronic system 2000 (e.g., at least one of the controller 2010 and the memory 2030) may include at least one or more of the semiconductor packages according to any of the above-described embodiments and semiconductor packages that are modified and changed within the scope of the inventive concept.

The electronic system 2000 may be applied to a portable phone, a desk-top computer, a lap-top computer, a tablet personal computer (PC), a game console, a navigation device, a digital camera, a personal digital assistant (PDA), a wireless phone, a digital music player, or all electronic products capable of transmitting and/or receiving information in wireless environments.

Hereinafter, configurations and effects of the inventive concept will be described in further detail with reference to specific experimental examples and comparative examples. However, the examples are merely intended to facilitate understanding, but not intended to limit the scope of the inventive concept.

A temperature change experiment was conducted on a semiconductor package in which a modem chip and a DRAM chip are mounted on a package substrate as shown in FIG. 1.

A semiconductor package (Comparative example 1) that is devoid of a silicon heat-dissipation plate, a semiconductor package (Experimental example 1) including a silicon heat-dissipation plate by using a typical DAF as shown in FIG. 1, a semiconductor package (Experimental example 2) including a silicon heat-dissipation plate by using a thermal DAF as shown in FIG. 1, a semiconductor package (Experimental example 3) including a silicon heat-dissipation plate by using a thermal DAF as shown in FIG. 1, and adopting an EMC containing filler as a molding member, and a semiconductor package (Experimental example 4) including a silicon heat-dissipation plate by using a typical DAF as shown in FIG. 8 were each manufactured. Specific configurations of the respective examples are arranged as shown in Table 1.

Temperature variation was measured while supplying power of about 1.55 W to each semiconductor package under a condition of an air temperature of 25° C., and measurement results are arranged in Table 1.

TABLE 1

| | Silicon heat-dissipation body | Thermal DAF | Filler EMC | Thermal resistance (Experiment) (° C./W) | Variation (%) compared to Comparative example 1 |
|---|---|---|---|---|---|
| Comparative example 1 | X | X | X | 9.87 | (Reference) |
| Experimental example 1 | FIG. 1 | X | X | 9.28 | −5.9 |
| Experimental example 2 | FIG. 1 | ○ | X | 9.02 | −8.6 |
| Experimental example 3 | FIG. 1 | ○ | ○ | 8.18 | −17.1 |
| Experimental example 4 | FIG. 8 | X | X | 9.31 | −5.7 |

The thermal resistance obtained by the experiments refers to the temperature variation per unit power supplied to each semiconductor package and is expressed in units of ° C./W. As the dissipation of heat becomes smoother, the temperature may rise at a lower rate, and the thermal resistance may be lower.

As shown in Table 1, it can be inferred that the silicon heat-dissipation body, the thermal DAF, and the filler contained in the EMC all contributed to heat dissipation.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first semiconductor chip;
a second semiconductor chip attached to an upper surface of the first semiconductor chip;
a first silicon heat-dissipation body thermally connected to at least one of the first semiconductor chip and the second semiconductor chip; and
a molding member configured to surround the first semiconductor chip and the second semiconductor chip,
wherein the first silicon heat-dissipation body has an exposed upper surface with respect to the molding member, and
wherein the first silicon heat-dissipation body is not connected to any one of the first semiconductor chip and the second semiconductor chip included in the semiconductor package, by an electrically conductive interconnection.

2. The semiconductor package of claim 1, wherein the first silicon heat-dissipation body is single-crystalline silicon or polycrystalline silicon.

3. The semiconductor package of claim 1, wherein the first silicon heat-dissipation body is adhered to at least one of the first semiconductor chip and the second semiconductor chip by a die-attach film (DAF).

4. The semiconductor package of claim 3, wherein the DAF comprises a thermal DAF including a thermally conductive filler.

5. The semiconductor package of claim 1, wherein the first semiconductor chip is mounted as a flip-chip type on a package substrate.

6. The semiconductor package of claim 5, wherein the second semiconductor chip is mounted on the first semiconductor chip such that an active surface of the second semiconductor chip faces the first silicon heat-dissipation body.

7. The semiconductor package of claim 6, wherein the second semiconductor chip is mounted on the first semiconductor chip with a portion overhanging an edge of the first semiconductor chip to form an overhang portion of the second semiconductor chip.

8. The semiconductor package of claim 7,
wherein the overhang portion of the second semiconductor chip comprises a bonding pad, and
wherein the bonding pad of the overhang portion is electrically connected to the package substrate through a bonding wire.

9. The semiconductor package of claim 1, wherein the first silicon heat-dissipation body is attached to the upper surface of the first semiconductor chip and vertically extends from the upper surface of the first semiconductor chip to an upper surface of the semiconductor package.

10. The semiconductor package of claim 1,
wherein the first silicon heat-dissipation body is attached to the upper surface of the first semiconductor chip, the first silicon heat-dissipation body vertically extending from the upper surface of the first semiconductor chip to an upper surface of the semiconductor package,
wherein the semiconductor package comprises a second silicon heat-dissipation body connected to an upper surface of the second semiconductor chip, the second silicon heat-dissipation body vertically extending from the upper surface of the second semiconductor chip to the upper surface of the semiconductor package, and
wherein upper surfaces of the first silicon heat-dissipation body and the second silicon heat-dissipation body form portions of the upper surface of the semiconductor package.

11. The semiconductor package of claim 10,
wherein the upper surface of the first silicon heat-dissipation body is substantially coplanar with the upper surface of the second silicon heat-dissipation body, and
wherein the surface area of the upper surface of the second silicon heat-dissipation body is larger than the surface area of the upper surface of the first silicon heat-dissipation body.

12. The semiconductor package of claim 10, further comprising:
a plurality of memory chips directly adhered to the first semiconductor chip, the second semiconductor chip being one of the plurality of memory chips,
wherein the second silicon heat-dissipation body is formed on the plurality of memory chips.

13. The semiconductor package of claim 1, wherein the first silicon heat-dissipation body is connected to an upper surface of the second semiconductor chip and configured to extend in a lateral direction over an upper surface of the first semiconductor chip.

14. The semiconductor package of claim 13, further comprising a second silicon heat-dissipation body connected to the upper surface of the first semiconductor chip, the second silicon heat-dissipation body vertically extending from the upper surface of the first semiconductor chip to a lower surface of the first silicon heat-dissipation body.

15. The semiconductor package of claim 1, wherein the first heat-dissipation body is metal and is connected to the upper surface of the first semiconductor chip, the first heat-dissipation body vertically extending from the upper surface of the first semiconductor chip to an upper surface of the semiconductor package.

16. The semiconductor package of claim 1, comprising a first memory chip and a second memory chip on the first semiconductor chip with a path formed between the first memory chip and the second memory chip, the second semiconductor chip being one of the first memory chip and second memory chip,
wherein the first silicon heat-dissipation body includes a portion positioned along the path, and a first side surface of the first silicon heat-dissipation body extends to face at least three side surfaces the first memory chip and a second side surface of the first silicon heat-dissipation body extends to face at least three side surfaces the second memory chip.

17. The semiconductor package of claim 1, comprising a first memory chip and a second memory chip, which are offset in a lateral direction and sequentially stacked on the first semiconductor chip, the second semiconductor chip being one of the first memory chip and second memory chip,
wherein the first silicon heat-dissipation body is connected to the upper surface of the first semiconductor chip and vertically extends from the upper surface of the first semiconductor chip to an upper surface of the semiconductor package, and
wherein at least a portion of the first silicon heat-dissipation body extends toward the first memory chip under the second memory chip.

18. A semiconductor package comprising:
a package substrate;
a logic chip mounted on the package substrate;
at least one memory chip on the logic chip, the at least one memory chip being formed on an upper surface of the logic chip;
a molding member configured to encapsulate the logic chip and the at least one memory chip; and
a silicon heat-dissipation body adhered to the upper surface of the logic chip, the silicon heat-dissipation body having at least one surface exposed with respect to the molding member to the outside of the semiconductor package.

19. The semiconductor package of claim 18, wherein the silicon heat-dissipation body includes an upper surface forming at least a part of an upper surface of the semiconductor package.

20. An electronic system comprising:
a controller;
a memory configured to store data;
an interface circuit configured to transmit and receive data to and from an external device; and
a bus configured to connect the controller, the memory, and the interface circuit such that the controller, the memory, and the interface circuit communicate with each other,
wherein at least one of the controller and the memory comprises the semiconductor package of claim 1.

* * * * *